United States Patent [19] [11] 4,201,939
Lee et al. [45] May 6, 1980

[54] MULTIPROBE CONTACT MONITOR AND CONTROL SYSTEM

[75] Inventors: Edward C. Lee; Thillaigovindan Natarajan, both of Dallas, Tex.

[73] Assignee: Texas Instruments Incorporated, Dallas, Tex.

[21] Appl. No.: 918,905

[22] Filed: Jun. 26, 1978

[51] Int. Cl.² .................. G01R 31/02; G01R 1/06
[52] U.S. Cl. .................. 324/158 P; 324/72.5; 324/148 F
[58] Field of Search ........... 324/158 P, 158 F, 72.5, 324/149; 73/105

[56] References Cited
U.S. PATENT DOCUMENTS
3,446,065   5/1969   Wiesler et al. .................. 73/105

Primary Examiner—Rudolph V. Rolinec
Assistant Examiner—Ernest F. Karlsen
Attorney, Agent, or Firm—William E. Hiller; Melvin Sharp; James T. Comfort

[57] ABSTRACT

A planarization and overtravel control circuit is disclosed utilized in conjunction with a multiprobe test system for testing microcircuits disposed on a semiconductor wafer surface. The planarization and overtravel control circuit enables the monitoring of the planarization limit required between data detector probe tips making contact with the integrated circuits on the semiconductor wafer. Overtravel, the distance the data detector probe tips travel into the semiconductor wafer, is also monitored by this apparatus.

7 Claims, 3 Drawing Figures

MULTIPROBE CONTACT MONITOR AND CONTROL SYSTEM

BACKGROUND OF THE INVENTION

This invention relates to a planarization and overtravel control citcuit and the use of such a circuit in a multiprobe test system that utilizes a z-axis detector assembly having a plurality of data-detector probes for sensing surface contacts in the z-axis, detecting surface edges, enabling the monitoring of planarization, and controlling overtravel into the surface of a semiconductor slice.

In the formation of electronic circuits, integrated circuits may be fabricated from thin semiconductor slices having a multiplicity of matrices or microcircuits thereon. The general practice is for each slice to contain a multiple of identical repeating matrices of the same type of microcircuits. The individual unit or circuit is sometimes referred to as an integrated circuit chip or an individual bar.

Before distribution, the present practice is to test each of the circuits of each integrated chip on a slice or wafer prior to separating the slice into the desired integrated circuit components or combinations thereof.

Since each microcircuit or integrated circuit of each wafer is normally positioned in a predetermined precise relation with respect to adjacent circuit units, it is possible to test the circuitry if the probe can be accurately located on each preselected point that corresponds to the circuit to be tested. It is possible, for example, to test several different circuits at the same time on any one integrated circuit.

In the test procedure, there are several obstacles to overcome in order to have reliable testing without damaging the slice. One of the difficulties experienced in the use of testing probes which include a supporting body having a needle connected thereto, is that the point of the probe tip may form a scratch on the surface of the semiconductor wafer as it is contacted by the point. This is caused by the lack of an effective z-axis control. The z-axis is the direction established by the vertical movement of the chuck or moveable support of the semiconductor slice with respect to the probe tips. Among other things, the z-axis control is needed to compensate for surface warpage of slices which may be as much as 5 mils across the surface of a large slice, in determining the point of contact with the wafer, and in determining when the probe tips are off the slice, i.e. edge detection.

Semiconductor slice testing is performed on a multiprobe system such as the multiprobe system manufactured by Electroglas Corp., Menlo Park, California, model 1034X. The multiprobe machine contains a probe card which is a printed circuit board having attached thereto a series of data probes for injecting signals and collecting test data from the semiconductor slice. The present practice includes an edge sensor on the probe card which is similar to a data probe, but having an electrical switch mechanism. Operationally, the conventional edge sensor functions such that when the probe tip makes contact with the silicon slice, an electrical open is caused. This open is detected by the multiprobe system and allows for a continuance for testing procedures. When the chuck or support block for the semiconductor slice is vertically moved to make contact with the probe tips and no contact is detected by the edge sensor, the open condition will not occur and the multiprobe system will perform an indexing procedure and move the slice such that the data probes are over the next row of integrated circuit chips. This conventional edge sensor has been found to be unreliable in the art and the cause of a significant amount of down time of the multiprobe system and damage to chips which results when the chuck is continuously moved upward and probe tip contact is not identified. After the probe tips make contact with the slice, it is necessary for the chuck to move an additional 1-5 mils of overtravel in order to break through the oxide layer and make good electrical contact with the active circuit elements, a technique called scrub-in. If the probe contact with the slice is not identified, the overtravel cannot be controlled and the result is probe tip breakage, excessive overtravel, which damages chips and causes machine downtime.

One device for overcoming this basic problem of z-axis control may be found in co-pending application "Method and Apparatus for Determining Probe Contact", Lee Reid, Ser. No. 873,564 filed Jan. 30, 1978. In the latter co-pending application, a device is disclosed for edge-sensing and z-axis control. This device is in the form of a probe having a force sensitive material attached thereto such that when surface contact is made with the probe tip, the force distributed over the force sensitive material generates a signal that is detected by an external detector circuit and delivered to a multiprobe system. This device is used to sense the edge of a semiconductor slice having a plurality of integrated circuits thereon.

A further problem found in multiprobe test systems is the fact that the nature of the semiconductor slice is such that the integrated circuits defined thereon are in a patterned series of chips which may be rectangular in geometry. Due to the circular nature of the semiconductor slice, there results a series of partial integrated circuit chips on the edges of the semiconductor slice. The use of a single edge sensor will identify approximately half of the partial bars as a surface to be tested and the result is that the multiprobe system will attempt to test these partial bars, wasting time, identifying the partial bars to be a bad circuit, and thereby inking the partial bar for identification. The same problem is encountered in testing a broken semiconductor slice which gives rise to an even increased number of partial bars making edge detection of even greater importance.

Co-pending application "Four-Quadrant, Multiprobe Edge Sensor for Semiconductor Wafer Probing", Reid et al, Ser. No. 879,038 filed Feb. 21, 1978 presents a technique and apparatus for solving the partial bar testing problem. In the latter co-pending application, the single data-detector device is replaced with a four-quadrant data-detector device assembly. The four-quadrant edge sensing assembly includes a printed circuit board having a plurality of date probes physically and electrically connected thereto and further having four data-detector probes on the printed circuit board such that when testing a semiconductor slice, the four data-detector probes are found in each corner of an integrated circuit chip; partial integrated circuit chips may be detected as well as the edge of the slice. The signals generated by the force sensitive material found in each of the four data-detector probes are detected by a detector circuit having four channels which in turn deliver the signals to a multiprobe system which enables the identification of partial bars and indexing of the support block, to test the next row of integrated circuit chips.

Although the four-quadrant data-detector approach solves the partial bar and broken chip problem, there still exists a problem in the multiprobe test scheme with respect to monitoring the planarization of the data probes, identification of broken data probes or malfunctioning data probes, and control of the overtravel of the probe tip of the data probe into the surface of the semiconductor slice.

By placing a plurality of data-detector probes on an electrical support, as for example, a printed circuit board, it is possible to monitor the z-axis contact of each and every data-detector probe upon contact with the semi-conductor slice. The signals generated by the force sensitive material on each of the data-detector probes are delivered to a detector circuit which in turn will deliver relevant information to a multiprobe device and/or minicomputer for evaluation of the timing of the data-detector probe contact with the semiconductor slice surface to provide effective monitoring of the z-axis movement which will result in effective monitoring of planarization, control of overtravel, probe tip contact identification, and edge sensing. Such a system is disclosed in copending U.S. application Ser. No. 893,118 "Multiprobe Test System and Method of Using the Same", Lee R. Reid et al, filed Apr. 4, 1978.

SUMMARY OF THE INVENTION

In accordance with the present invention, it is proposed to use a planarization and overtravel control circuit to monitor the planarization and overtravel of the plurality of data-detector probes used in a multiprobe test system. The plurality of data detector probes are electrically connected to separate channels of a detector circuit for monitoring when a signal is delivered from the force sensitive material on each of the plurality of data-detector probes signifying contact with the semiconductor slice. The planarization and overtravel control circuit is electrically connected to the output of the detector circuit such that by the use of a plurality of logic gates for receiving the signal from each channel of the detector circuit and also receiving an enable signal from the multiprobe device, the planarization and overtravel control circuit can effectively set the latching circuit within the detector circuit when the planarization limit is exceeded. By the use of a flip flop enabled by a signal signifying contact of any of the data-detector probes with the semiconductor slice a clock pulse is received from the multiprobe system signifying that the chuck having the semiconductor slice exposed thereon is moving in a vertical or z-axis direction toward the plurality of data-detector probes. A counter is electrically connected to a second flip flop circuit to receive and count clock pulses such that when a predetermined number of clock pulses have been received, the planarization and overtravel control circuit will deliver a signal to the detector circuit to disable the latch designating all data-detector probes making contact with the semiconductor slice after the planarization limit is exceeded will not be recognized to be within the limit, i.e. the light emitting diode for that channel will not be actuated. By continually counting the clock pulses from the multiprobe device, th planarization and overtravel control circuit using a comparator will compare the clock pulses to a predetermind clock pulse setting to determine when the data probe tips have scrubbed into the semiconductor slice a predetermined distance. Further, an alarm circuit is electrically connected to the output of the detector circuit. When the planarization limit is exceeded, an alarm will notify the user of such a condition. By having four of the plurality of data-detector probes located in each of the four quadrants of the integrated circuit chip being tested on the semiconductor slice, if any one of those four data-detector probes fail to make contact with the chip at a time instant falling within the planarization limit, the planarization and overtravel control circuit is effective to reset the latching circuit within the detector circuit, thereby controlling overtravel of the data-detector probes by causing the multiprobe system to perform an indexing procedure.

In testing integrated circuits utilizing a planarization and overtravel control circuit, the data-detector probe tips must first be initialized by assuring that the probe tips all lie in the same plane (i.e. planarizing). After initialization, the moveable support means supporting the semiconductor slice must be raised in order to make contact with the plurality of data-detector probes. As the moveable support means is being raised, a series of pulses are delivered to a planarization and control circuit. Planarization may be monitored based on this clock pulse information by starting a clock upon first contact of the semiconductor slice by one of the plurality of data-detector probes and further based on the known distance traveled per clock pulse setting. A planarization alarm is provided whenever the predetermined planarization limit is exceeded. Subsequent to monitoring planarization of the data-detector probe tips, overtravel into the semiconductor slice may be controlled by comparing a predetermined number of clock pulses with the on-line clock counter and allowing the moveable support of the semiconductor slice to travel only up to that predetermined number of clock pulses. Testing of the integrated circuit chips found on the semiconductor slice may then be performed by delivering test signals by way of the data-detector probes into the integrated circuit chip and evaluating those signals.

DETAILED DESCRIPTION OF THE DRAWINGS

Figure 1:
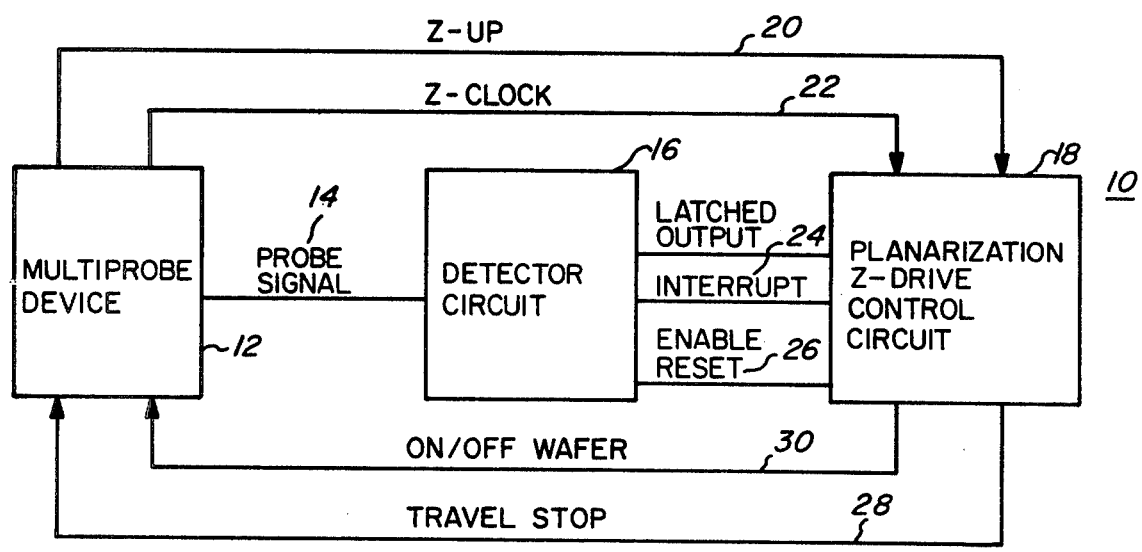
FIG. 1 is a block diagram illustrating a multiprobe system having a planarization and overtravel control circuit used in conjunction with a detector circuit and a multiprobe device in accordance with the present invention.

Referring now to the drawings and more specifically to FIG. 1, a multiprobe system 10 is illustrated in a block diagram form. A multiprobe device 12, as for example, the multiprobe device made and manurfactured by Electroglas Corporation, Menlo Park, California, model 1034X is utilized to test integrated circuits on a semiconductor wafer surface. The multiprobe device 12 utilizes a series of data-detector probes (not shown) whereby the data-detector probe performs the dual function of z-axis control and data testing. The series of data detector probes will deliver a series of probe signals into a detector circuit 16 such as the detector circuit illustrated in FIG. 2 and described hereinbelow. Each channel of the detector circuit will then electrically interface with a planarization z-drive control circuit 18 such as the planarization-overtravel control circuit illustrated in FIG. 3 and described hereinbelow. Operationally, when the multiprobe device begins testing a semiconductor surface having a plurality of integrated circuits disposed thereon, a z-up signal 20 is sent to the planarization and overtravel control circuit 18 enabling that circuitry to receive the z-clock signal 22 upon contact of one of the series of data-detector probes with the semiconductor wafer surface.

The data-detector probes are contained in the multiprobe device 12. Upon contact of a data-detector probe with a semiconductor wafer surface, a probe signal 14 is sent to the detector circuit 16 where the signal is screened and an interrupt signal 24 is further delivered to the planarization and overtravel control circuit 18 enabling that section of circuitry dealing specifically with planarization and overtravel. When it is determined that all of the data-detector probes have not made contact with the semiconductor surface within a predetermined planarization limit, prove signals are inhibited by the detector circuit from being delivered to the planarization circuitry. The multiprobe device 12 then continues the movement of the semiconductor wafer surface toward the plurality of data-detector probes in an effort to scrub in the data-detector probe tips into the semiconductor surface. The planarization and overtravel control circuit 18 monitors the distance the probe tips scrub into the surface and will deliver a travel stop signal 28 to the multiprobe device 12 halting the movement of the semiconductor wafer. The planarization and overtravel control circuit will further monitor whether any of the plurality of data probes is off the semiconductor surface, i.e. is on the edge of the semiconductor wafer and will issue an on wafer or off wafer signal 30 to the multiprobe device 12 to enable the multiprobe device 12 to index the data-detector probes to the next row of integrated circuits found on the semiconductor wafer.

Figure 2:
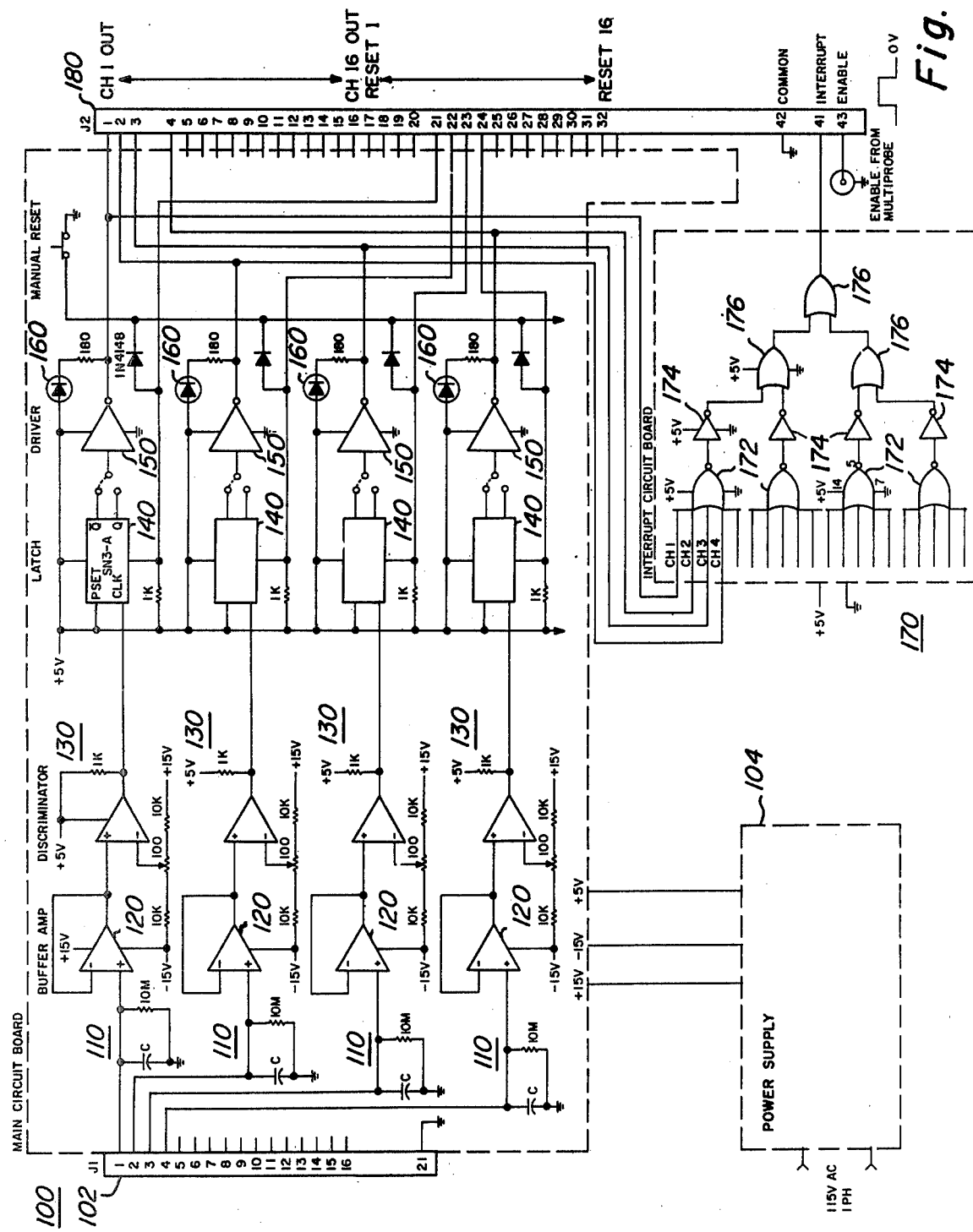
FIG. 2 is an electrical circuit diagram of a detector circuit used in coordination with and electrically connected to a planarization and overtravel control circuit in accordance with the present invention.

Referring now to FIG. 2, a detector circuit 100 is illustrated. The detector circuit 100 receives a series of signals from a plurality of data-detector probes (not shown) by way of data bus 102. The detector circuit board 100 demonstrates four independent detector channels to be used by one of the plurality of data-detector probes (not shown). A power supply 104 is utilized to provide a ±15 volt and +5 volt power source to the detector circuit 100. Each channel comprises an RC filter assembly 110 electrically connected to a unity gain buffer amplifier 120 where the RC filter 110 filters noise spikes and dampens the response time of the voltage signal received from the data-detector probes. The unity gain buffer amplifier 120 transforms the voltage signal from a high impedance signal to a low impedance signal. The unity gain buffer amplifier 120 may be of the type made and manufactured by Texas Instruments Incorporated, Dallas, Texas, model TL084N. This low impedance signal is then delivered to a level discriminator assembly 130. The level discriminator 130 is of the threshold level type whereby unless the signal reaches a predetermined threshold voltage, for example, 30 millivolts, the low impedance signal will not be recognized and essentially blocked. If, however, the low impedance signal is above the threshold limit, the discriminator 130 will be set to a maximum voltage as, for example, the 5 volts found in the FIG. 2 circuit. The level discriminator 130 may be of the type made and manufactured by Texas Instruments Incorporated, Dallas, Texas, model LN339N. After discriminating against low level noise signals, the desired signal at a nominal 5 volts voltage level is delivered to a latch circuit 140, which latches the signal to, for example, a 0 voltage and delivers that signal to a buffer/driver 150. The buffer/driver 150 provides the necessary power to enable the light emitting diode 160 as well as providing signals to the interrupt circuit and the planarization and overtravel control circuit described hereinafter. The latching circuit may be of the type made and manufactured by Texas Instruments Incorporated, Dallas, Texas, model 7474N, while the buffer/driver may be the type made and manufactured by Texas Instruments Incorporated, Dallas, Texas, model 7404N. The latch signal is delivered to an interrupt circuit 170 and may be grouped in units of four, for example, and delivered to a series of "NOR" gates 172 followed by an inversion of the signal by inverters 174, and finally channeled to a series of "OR" gates 176. The "NOR" gates 172, inverter-buffer driver 174 and "OR" gates 176 may also be of the type made and manufactured by Texas Instruments Incorporated, Dallas, Texas, models 74S260N, 7404N, and 7432N, respectively. When any one of the data-detector probes makes contact with the semiconductor surface, an interrupt signal will be delivered to a planarization and overtravel control circuit hereinafter described. Data bus 180 will then deliver the probe signal to the planarization and overtravel control circuit and provide a signal return by way of a reset signal to the latch circuits 140.

Figure 3:
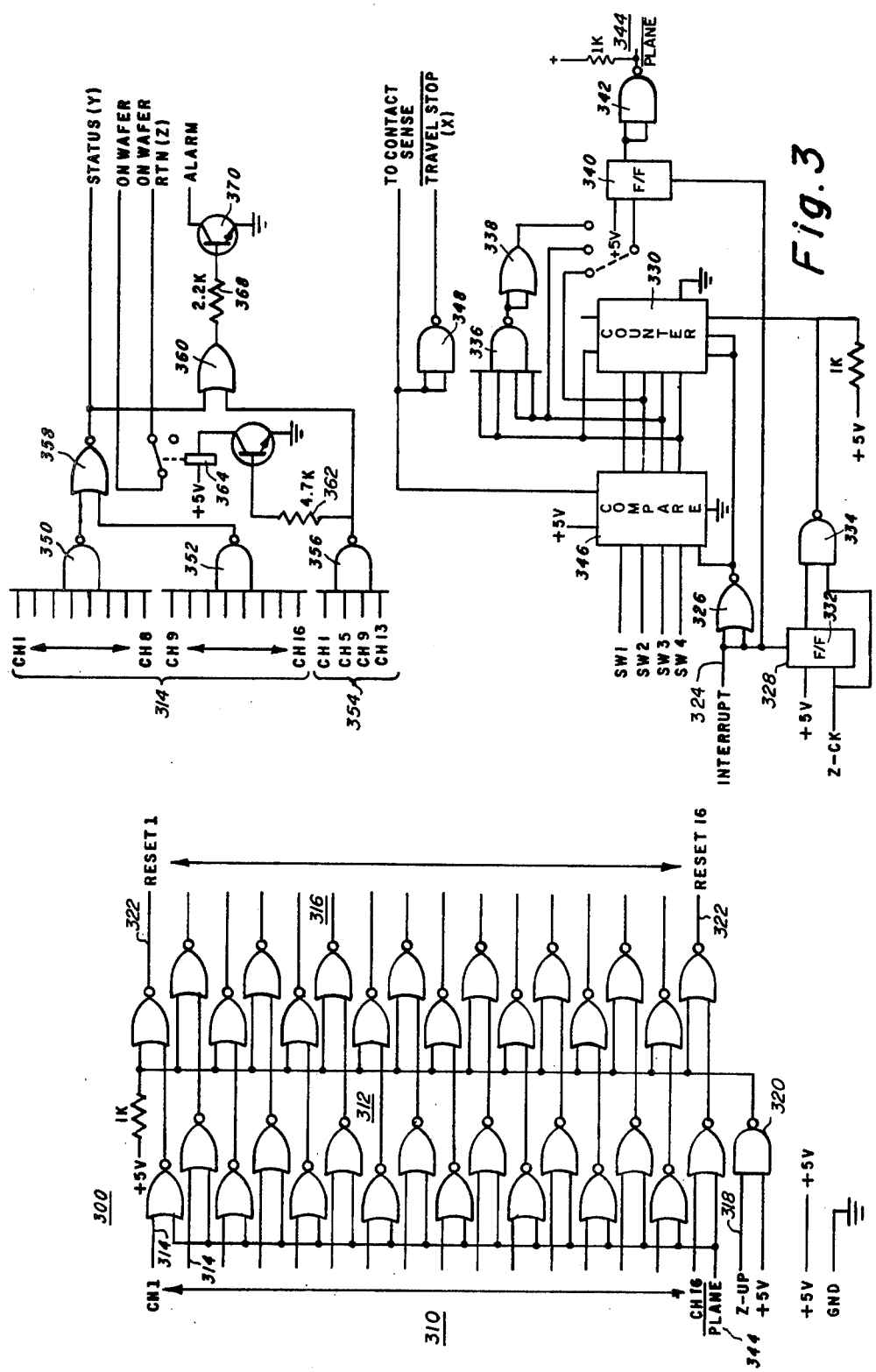
FIG. 3 is an electrical circuit diagram of a planarization and overtravel control circuit in accordance with the present invention.

Referring now to FIG. 3, a planarization and overtravel control circuit 300 is illustrated. The planarization and overtravel control circuit 300 may be used in the multiprobe test system illustrated in FIG. 1. The planarization and overtravel control circuit 300 shown in FIG. 3 has three major functioning parts. The first major part of the planarization and overtravel control circuit 300 is the reset circuitry 310. The reset circuitry 310 comprises a first plurality of "NOR" gates 312, with each of the "NOR" gates 312 receiving a signal from a single channel of the detector circuit shown in the multiprobe test system of FIG. 1 and specifically illustrated in FIG. 2. The first plurality of "NOR" gates 312 further receive a signal from the second major portion of the planarization and overtravel control circuit, planarization circuitry, designating that the planarization limit has been achieved. This second major circuit portion will be described hereinafter. The output of the first plurality of "NOR" gates 312 provides a signal to the input of a second plurality of "NOR" gates 316. A further signal is provided to the second plurality of "NOR" gates 316 by the multiprobe device not shown. The multiprobe device provides a z-up signal 318 comprising one input to a "NAND" gate 320, such as model SN7403 made by Texas Instruments Incorporated, Dallas, Texas, signifying that the semiconductor wafer surface is being moved in a vertical direction toward a plurality of data-detector probes. The "NAND" gate 320 has a second input which is connected to the +5 volt power source. The output of the second plurality of "NOR" gate 316 is then delivered to each of the respective channels of the detector circuit as an enable/disable to the latch circuit.

The second major circuit portion in the planarization and overtravel control circuit 300 comprises a planarization and overtravel circuit network whereby an interrupt signal 324 is received from a detector circuit signifying that at least one of the data-detector probes has made contact with the semiconductor surface slice. This interrupt signal 324 is delivered to "NOR" gate 326 and a flip flop circuit 328 where the flip flop circuit 328 is of the type made and manufactured by Texas Instruments Incorporated, Dallas, Texas, model SN7474. The interrupt signal delivered through "NOR" gate 326 will further enable a counter 330. The counter may be of the type made and manufactured by Texas Instruments Incorporated, Dallas, Texas, model SN7493. Upon the enabling of the flip flop 328 and the counter circuit 330, the circuitry is capable of receiving a clock pulse signal 332 from the multiprobe device. This clock pulse signal 332 is delivered through the flip-flop 328 and further provided as an input to a "NAND" gate 334 before being sensed by counter 330. The counter 330 may be a four bit counter where each bit line of the counter 330 may be tied to a line designating a planarization limit either directly or via a series of logic gates 336 and 338; whereupon achieving a pulse on the bit line of the counter 330 will activate a second flip-flop 340 and a signal will be input to a "NAND" gate 342 and delivered to the first plurality of "NOR" gates 312.

Operationally, the planarization aspect of the second major portion of the planarization and overtravel control circuit performs by first reading the clock signal 332 with a counter 330; upon receiving information that the first data probe has made contact with the semiconductor surface, an interrupt signal 324 is received. By measuring the distance that the semiconductor wafer surface will travel upon each clock pulse, it can be determined how many clock pulses are needed to move the semiconductor surface a predetermined distance and thus by electrically tying the flip-flop 340 to the proper bit line of the counter 330, the planarization limit can be registered and a signal 344 is delivered back to the reset circuit 310 which will reset the latches on only those detector channels where the data probe has not made contact with the semiconductor surface within the planarization limit.

Independent of the planarization limit, the clock pulse signal 332 will continue to be read by counter 330 and a comparator 346 such as a comparator made by Texas Instruments Incorporated, Dallas, Texas, model SN7485, will be set at a predetermined value to be compared with the number of pulses registered in the counter 330. Upon reaching the predetermined setting of the comparator 346, a signal will be delivered to the multiprobe device (not shown) through a "NAND" gate 348 to stop the vertical movement of the semiconductor wafer toward the plurality of data detector probes.

The third major portion of the planarization and overtravel control circuit 300 is the circuitry providing for edge detection and alarming the user when the planarization limit is exceeded. The signals 314 are delivered to first and second "NAND" gates 350 and 352, except for four designated signals 354 which are probe signals from four data-detector probes located in the four quadrants of an integrated circuit disposed on a semiconductor surface. These four signals 354 are delivered to "NAND" gate 356. The outputs of "NAND" gates 350 and 352 are delivered to "NOR" gate 358, the output of which designates the status of the data-detector probes used strictly for testing the semiconductor wafer. The output of "NOR" gate 358 is further delivered to OR gate 360 along with the output of "NAND" gate 356 having as its input the detector signals 354 from the data-detectors found on the four quadrants of the integrated circuit. The output of the "NAND" gate 356 is further connected by way of a resistor 362 and relay circuit 364 which opens or closes the two signals from the multiprobe device designating whether one of the four detector probes found on the four quadrants of the integrated circuit chip has not made contact with the integrated circuit and therefore an edge condition exists and the multiprobe device should act accordingly by indexing and moving to the next row of integrated circuits. The output of the OR gate 360 is delivered by way of a resistor 368 to an alarm 370 to notify the user that the plurality of data-detector probes are not in planarization within the predetermined planarization limit.

Operationally, after the planarization signal 344 is delivered to the reset circuit 310 which sends a reset signal to the detector circuit latch thereby blocking any data probe signal sent upon contact with the semiconductor wafer, those data-detector probes not making contact within the planarization limit will have their respective signals blocked and when probe signals 314 are delivered to the "NAND" gates 350 and 352, an alarm 370 will sound. However, if the designated four quadrant probes found in the four quadrants of the integrated circuit fail to make contact, an off-wafer signal is delivered to the multiprobe device by the relay 364, thereby causing the multiprobe device to properly index to the next row of the integrated circuit.

While the present invention has been described and illustrated with respect to the specific embodiments, it is to be understood that various modification may be made without departing from the spirit and scope of the present invention.

What is claimed is:

1. A planarization and overtravel control circuit for a multiprobe test system having a multiprobe device with a plurality of data-detector probes attached thereto for testing a semiconductor wafer having a plurality of integrated circuits disposed thereon, and further detecting contact of said plurality of data-detector probes with the surface of said semiconductor wafer, said plurality of data-detector probes electrically connected to a detector circuit where signals from said data-detector probes are electrically screened to designate when any one of said plurality of data-detector probes has made contact with the surface of said semiconductor wafer; said planarization and overtravel control circuit comprising:

reset circuit means for delivering an electrical signal to a latch circuit within said detector circuit for initializing said latch circuit to receive a signal from said plurality of data-detector probes when contact is made with the surface of said semiconductor wafer;

planarization monitor circuit means electrically connected to said reset circuit means for determining when said data-detector probes lie within a predetermined planarization limiting resetting the said latch circuit of said detector circuit when any one of said plurality of data-detector probes falls outside said planarization limit; and overtravel control circuit means for determining when the data-detector probes have travelled a predetermined distance into said semiconductor wafer.

2. A planarization and overtravel control circuit as set forth in claim 1 further including alarm signal circuit means for generating a signal signifying that said planarization limit has been exceeded.

3. A planarization and overtravel control circuit as set forth in claim 1 wherein said reset circuit means comprises a first and second plurality of logic gates wherein said first plurality of logic gates receives signals from said detector circuit when any one of said plurality of data-detector probes makes contact with the surface of said semiconductor wafer and further receives a signal from said planarization monitor circuit means when said planarization limit has been reached and wherein said second plurality of logic gates receives a first signal from said multiprobe device signifying the enabling of said device and a second signal from said first plurality of logic gates.

4. A planarization and overtravel control circuit as set forth in claim 1 wherein said planarization monitor circuit means comprises:
input signal means for designating when the first of any of said plurality of data-detector probes has made contact with the surface of said semiconductor wafer;
first flip-flop means enabled by said input signal means for receiving a clock pulse from said multiprobe device signifying movement of the surface of said semiconductor wafer toward said plurality of data-detector probes;
first logic gate means electrically connected to said first flip-flop means and to said multiprobe device for receiving said clock pulse therefrom for delivering an electrical signal synchronously with the clock pulse received from said multiprobe device;
counter means electrically enabled by said input signal means and connected to said first logic gate means for counting the number of electrical signals representative of clock pulses from said multiprobe device; and
second flip-flop means electrically connected to said counter means such that when a predetermined number of clock pulses have been registered in said counter means, said second flip-flop means will deliver a signal by way of a second logic gate means to said reset circuit means to allow said latch circuit to be reset.

5. A planarization and overtravel control circuit as set forth in claim 4 wherein said overtravel control circuit means comprises:
comparator means electrically connected to and operably associated with said counter means for comparing the number of clock pulses registered in said counter means with a predetermined number of clock pulses; and
third logic gate means electrically connected to said comparator means for receiving the output of the said comparator means and providing an output to said multiprobe device to stop the movement of said semiconductor wafer toward said plurality of data-detector probes.

6. A planarization and overtravel control circuit as set forth in claim 1 further including edge detection circuit means comprising logic gate means receiving signals from four data-detectors probes placed in the four quadrants of an integrated circuit on the surface of said semiconductor wafer, the output of said logic gate means being electrically connected and operably associated with an electrical relay to provide a signal signifying that any one of said four quadrant-placed data-detector probes is off the surface of said semiconductor wafer.

7. A multiprobe test system for testing microcircuits comprising:
a multiprobe device having moveable support means for locating a semiconductor slice thereon;
probe support means located in parallel spaced relation to said moveable support means; and
a plurality of data-detector probes electrically connected to said probe support means for detecting the surface of said semiconductor slice and collecting data from the integrated circuits disposed on said semiconductor slice;
detector circuit means electrically associated with and connected to said plurality of data-detector probes for delivering an electrical signal signifying that said data-detector probes have made contact with said semiconductor slice; and
planarization and overtravel control circuit means electrically connected to and operatively associated with said detector circuit means for determining the planarization of the data-detector probes within a predetermined set limit and the amount of overtravel of said data-detector probes into the surface of said semiconductor slice.

* * * * *